US008639981B2

(12) United States Patent
Chong

(10) Patent No.: US 8,639,981 B2
(45) Date of Patent: Jan. 28, 2014

(54) FLEXIBLE SOC DESIGN VERIFICATION ENVIRONMENT

(75) Inventor: Andrew K. Chong, Cupertino, CA (US)

(73) Assignee: Apple Inc., Cupertino, CA (US)

(\*) Notice: Subject to any disclaimer, the term of this patent is extended or adjusted under 35 U.S.C. 154(b) by 179 days.

(21) Appl. No.: 13/220,139

(22) Filed: Aug. 29, 2011

(65) Prior Publication Data

US 2013/0055022 A1    Feb. 28, 2013

(51) Int. Cl.
*G06F 11/00* (2006.01)

(52) U.S. Cl.
USPC ............................................... 714/30; 714/28

(58) Field of Classification Search
USPC .................................. 714/28–31, 39, 45
See application file for complete search history.

(56) References Cited

U.S. PATENT DOCUMENTS

| | | | |
|---|---|---|---|
| 4,590,552 A | 5/1986 | Guttag et al. | |
| 5,970,241 A | 10/1999 | Deao et al. | |
| 6,018,815 A | 1/2000 | Baeg | |
| 6,311,292 B1 | 10/2001 | Choquette et al. | |
| 6,314,539 B1 | 11/2001 | Jacobson et al. | |
| 6,370,660 B1 | 4/2002 | Mann | |
| 6,380,724 B1 | 4/2002 | Mahurin et al. | |
| 6,408,414 B1 | 6/2002 | Hatada | |
| 6,587,981 B1 | 7/2003 | Muradali et al. | |
| 6,615,380 B1 | 9/2003 | Kapur et al. | |
| 6,691,251 B2 * | 2/2004 | Wong | 714/28 |
| 6,708,290 B2 * | 3/2004 | Swoboda et al. | 714/30 |
| 6,711,708 B1 | 3/2004 | Shimomura | |
| 6,745,356 B1 | 6/2004 | Wong | |
| 6,754,763 B2 | 6/2004 | Lin | |
| 6,757,856 B2 | 6/2004 | Bassett | |
| 6,766,501 B1 | 7/2004 | Duggirala et al. | |
| 6,839,654 B2 | 1/2005 | Rollig et al. | |
| 6,876,941 B2 | 4/2005 | Nightingale | |
| 6,941,504 B2 | 9/2005 | Berry, Jr. et al. | |
| 6,996,747 B2 | 2/2006 | Swoboda et al. | |
| 7,069,486 B2 | 6/2006 | Nagamine et al. | |
| 7,085,980 B2 | 8/2006 | Martin-de-Nicolas et al. | |
| 7,216,276 B1 * | 5/2007 | Azimi et al. | 714/733 |
| 7,340,658 B2 | 3/2008 | Seuring | |

(Continued)

FOREIGN PATENT DOCUMENTS

| | | |
|---|---|---|
| EP | 0869434 | 10/1998 |
| JP | 2002-122637 | 4/2002 |

OTHER PUBLICATIONS

European Search Report in Application No. 11192311.6 dated Mar. 23, 2012, 13 pages.

(Continued)

*Primary Examiner* — Scott Baderman
*Assistant Examiner* — Joseph Kudirka
(74) *Attorney, Agent, or Firm* — Rory D. Rankin; Meyertons, Hood, Kivlin, Kowert & Goetzel, P.C.

(57) ABSTRACT

A system and method of various SoC design verification techniques. A model of an SoC design is simulated in an emulator, and the emulator is connected to a debugger. Scripts are conveyed from a host computer to the debugger. The debugger translates the commands in the scripts from a first language into commands in a second language. The debugger then conveys the commands in the second language to the emulator. The debugger is also configured to utilize the same scripts to perform tests on an actual SoC on a development board.

22 Claims, 10 Drawing Sheets

(56) References Cited

U.S. PATENT DOCUMENTS

| | | | |
|---|---|---|---|
| 7,487,367 B2 | 2/2009 | Belnet et al. | |
| 7,493,247 B2 | 2/2009 | Memmi | |
| 7,496,818 B1 * | 2/2009 | Azimi et al. | 714/733 |
| 7,533,315 B2 | 5/2009 | Han et al. | |
| 7,536,597 B2 * | 5/2009 | McGowan | 714/30 |
| 7,676,698 B2 * | 3/2010 | McGowan | 714/30 |
| 7,930,604 B1 | 4/2011 | Azimi et al. | |
| 8,117,587 B1 * | 2/2012 | Testardi | 717/100 |
| 8,136,003 B2 | 3/2012 | Swoboda | |
| 2001/0034880 A1 * | 10/2001 | Dzoba et al. | 717/4 |
| 2002/0108094 A1 * | 8/2002 | Scurry | 716/5 |
| 2002/0133794 A1 | 9/2002 | Kanapathippillai et al. | |
| 2002/0184561 A1 | 12/2002 | Tagawa et al. | |
| 2003/0025490 A1 | 2/2003 | Chen | |
| 2004/0088659 A1 | 5/2004 | Mori | |
| 2004/0098643 A1 | 5/2004 | Schulz | |
| 2005/0193254 A1 | 9/2005 | Yee | |
| 2006/0069953 A1 | 3/2006 | Lippett et al. | |
| 2006/0156070 A1 | 7/2006 | Swoboda | |
| 2007/0214389 A1 | 9/2007 | Severson et al. | |
| 2007/0226702 A1 | 9/2007 | Segger | |
| 2008/0184150 A1 * | 7/2008 | Minato et al. | 715/771 |
| 2008/0222581 A1 * | 9/2008 | Banerjee et al. | 716/4 |
| 2009/0006808 A1 | 1/2009 | Blumrich et al. | |
| 2009/0282304 A1 | 11/2009 | Piry et al. | |
| 2010/0161309 A1 * | 6/2010 | Chartraire et al. | 703/28 |
| 2011/0289373 A1 * | 11/2011 | Klein et al. | 714/741 |

OTHER PUBLICATIONS

Mark Bohr, "The New Era of Scaling in an SoC World," Digest of Technical Papers, ISSCC 2009, Feb. 9, 2009, XP831742153, pp. 23-29.

"Setup the Debugger for a CoreSight System," Aug. 11, 2010, 27 pages.

International Search Report and Written Opinion in Application No. PCT/US2011/063311 mailed Mar. 29, 2012, 10 pages.

Fritsch, et al., "Speeding Up Simulation by Emulation-A Case Study," Design, Automation and Test in Europe Conference Date '99, Munich, Germany, Mar. 9-12, 1999, pp. 127-134.

* cited by examiner

| JSM Command | Argument 1 | Argument 2 |
|---|---|---|
| INIT | | |
| SHIR | Instruction | |
| SHDR | Length | Data |
| SHDM | Length | Pattern |
| MSIR | Instruction 1 | Instruction 2 |
| MMPR | Address | |
| MMPW | Address | Data |
| MMHR | Address | |
| MMHW | Address | Data |
| ⋮ | ⋮ | ⋮ |

INIT

SHIR STOP_CLK

WAIT

SHIR SEL_PARTITION

SHDR 51 0x00000 0x02000000

SHIR J1500I

SHDR 48 0x8000 0x00000000

⋮

SHIR SCAN_DUMP

SHDM 140192 1

100

FLEXIBLE SOC DESIGN VERIFICATION ENVIRONMENT

BACKGROUND

1. Field of the Invention

The present invention relates generally to design verification tools, and in particular to design verification systems and methods for developing systems on chips.

2. Description of the Related Art

The complexity of systems on chips (SoCs) continues to grow as increasing numbers of transistors are incorporated into SoCs. SoC implementations can include one or more processors and a variety of peripherals, all integrated onto one semiconductor substrate. The peripherals can be in various states of operation at the same time that the processor(s) are performing numerous other operations. The number of possible states in the SoC, all of which must generally provide correct operation, increases exponentially with complexity. Such complexity must be tested during the design and manufacture of the SoC to provide reasonable assurance that the SoC will function as designed and that the design is correct.

One common methodology used for the testing and debugging of SoCs is based on the Institute of Electrical and Electronics Engineers (IEEE) 1149.1 standard test access port and boundary-scan architecture, also known as joint test action group (JTAG). Debug controllers often utilize signals that are compliant with the JTAG protocol for testing actual physical SoCs. Prior to fabricating an actual SoC, most SoCs are modeled and simulated in a variety of simulation platforms. For example, various emulators have been developed that offer the ability to simulate SoC designs prior to fabricating the SoC in silicon. However, some of these emulators do not include a JTAG interface. Furthermore, debug controllers which execute commands and scripts for testing an actual physical SoC, typically use a JTAG interface to interface to the SoC when the SoC is fabricated. However, these debug controllers are not able to use this JTAG interface to communicate with emulators that lack a JTAG interface.

As the size of SoCs continues to increase, the amount of testing and debugging that needs to be performed also increases. Some tests may be lengthy and involve many lines of code. In addition, software developers are often required to use a low-level JTAG protocol compliant language to write debug and testing commands that will be incorporated into various testing scripts. Furthermore, the scripts that are used to test a hardware model of a SoC typically cannot be reused when a development board with a fabricated SoC is being tested. This means that the software developer will be required to write new scripts to test the physical SoC, instead of being able to reuse the existing scripts that were used to test the model of the SoC.

SUMMARY

In one embodiment, a design verification system may include a plurality of elements such as a host computer, debugger, and emulator. The emulator may include one or more software models of SoCs. In another embodiment, the design verification system may include a SoC on a development board in place of the emulator. One or more scripts may be invoked on the host computer, and the script(s) may include one or more commands in a first language. The first language may be a high-level language that obscures the details of a lower-level language used to control the DUT. In one embodiment, the first language may be JTAG state microcode (JSM).

The host computer may source a translator application to the debugger. The debugger may utilize the translator application to convert the script(s) from a first language into commands of a second language. In one embodiment, the second language may be a JTAG protocol compliant language. The debugger may convey the commands in the second language to the SoC model in the emulator. In another embodiment, the debugger may convey the commands in the second language to the SoC on the development board. The commands in the second language may be executed within the DUT to generate control signals and perform one or more tests. The same scripts that are used to perform debug and verification operations on the SoC model in the emulator may be reused to perform operations on the SoC on the development board.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which:

FIG. 6 is a table of JSM commands in accordance with one or more embodiments.

DETAILED DESCRIPTION OF EMBODIMENTS

Figure 1:
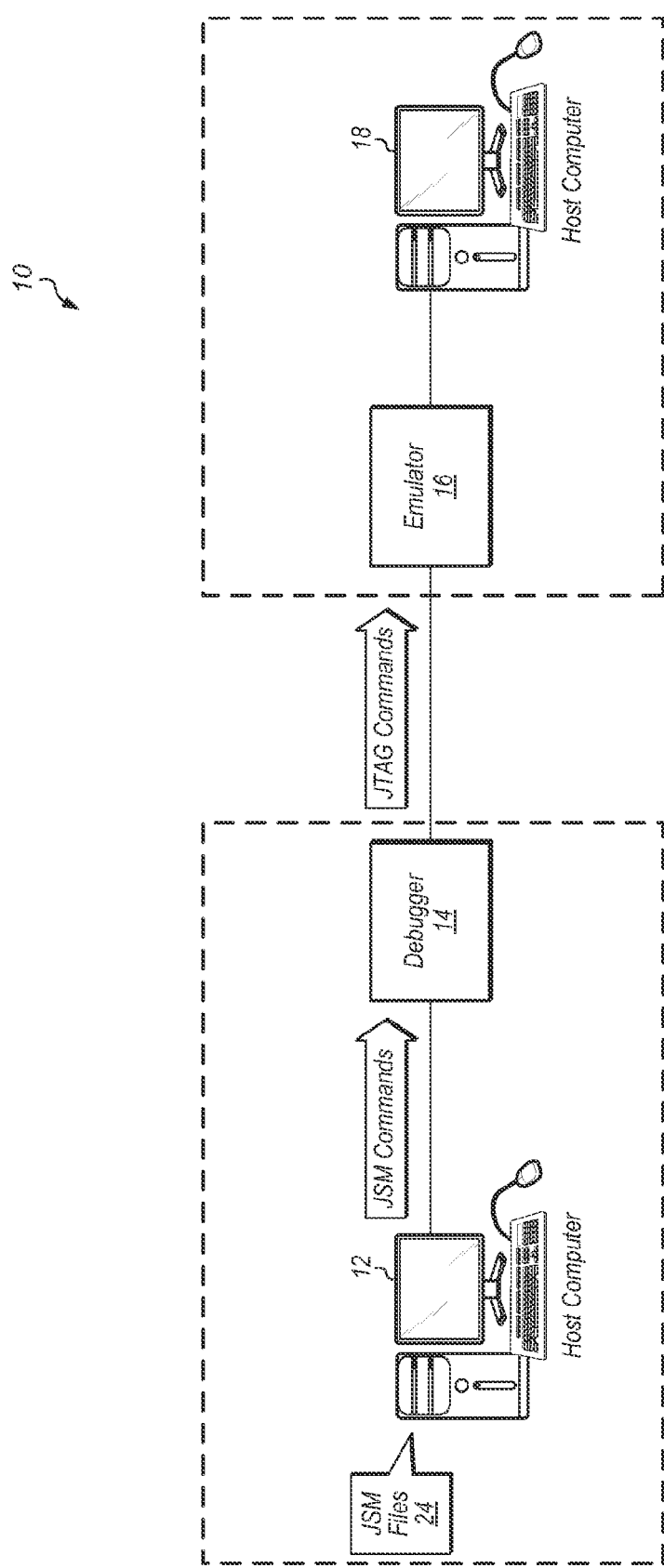
FIG. 1 is a block diagram illustrating one embodiment of a design verification system.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising a debugger . . . ." Such a claim does not foreclose the system from including additional components (e.g., a host computer, an emulator).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., a field programmable gate array (FPGA) or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, in a SoC having five processor cores, the terms "first" and "second" cores can be used to refer to any two of the five cores.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Referring now to FIG. 1, a block diagram illustrating one embodiment of a design verification system 10 is shown. In the illustrated embodiment, design verification system 10 includes a host computer 12, debugger 14, emulator 16, and host computer 18. It is noted that design verification system 10 may also include many other components and connections not shown in FIG. 1.

Host computer 12 may be utilized by a software developer or other user to enter commands and invoke scripts. The commands and scripts may be configured to test a software model of a SoC executing in emulator 16. In various embodiments, host computer 12 may display a command-line interface or console via which commands may be entered. In one embodiment the console may be a tool command language (Tcl) console. In various embodiments, host computer 12 may be any type of personal computer, laptop, server, or workstation, such as an Apple® Macintosh® computer or the like. In other embodiments, host computer 12 may be any type of computing device such as a smartphone, tablet, or the like. Host computer 12 may also be referred to as a user terminal.

Instead of a software developer using low-level test language commands to perform an operation, a high-level software language may be utilized to hide the low-level details specific to emulator 16. The language may include high-level commands to perform specific operations, wherein the high-level commands may be translated into JTAG commands at the debugger 14. In one embodiment, the high-level language may be referred to as JTAG state microcode (JSM). JSM may be a language that standardizes elements of the debug verification environment by introducing a new layer of abstraction on top of the JTAG protocol. JSM may include a specific syntax and semantics. The syntax may include the spelling, grammar, and/or format of the JSM language. The semantics may include the instructions and commands used in the JSM language.

Host computer 12 may store any number of scripts or files of commands, such as JSM files 24, and these scripts and files may be executed on debugger 14. JSM files 24 are representative of any number of files of JSM commands. JSM commands are commands written in the JSM language and may be stored within JSM files 24. JSM files 24 may also be referred to as scripts. In various embodiments, JSM files 24 may be written in a scripting language, such as Tool Command Language (Tcl), Practical Extraction and Report Language (PERL), Python, Expect, Bourne Shell, and C Shell. In various embodiments, individual JSM commands may be entered on the command line and executed one at a time. In one embodiment, a plurality of JSM commands may be stored in a JSM file 24 and then put into a directory on host computer 12 named "JSM".

The scripts may contain a plurality of JSM commands, and each script may be designed to perform a particular function or task. For example, a memory dump operation may be performed by invoking a script. In one embodiment, there may be thousands of JSM files called by the script to perform the memory dump operation. There may be a plurality of different types of memories within SoC 22, and there may be a separate JSM file for each type of memory. To perform the memory dump operation, there may be a main script file that calls each of the individual JSM files corresponding to each of the separate memory types. Each of the individual JSM files may be executed to read out the data from each memory type within SoC 22.

JSM files 24 may be executed to perform tests on a variety of different platforms. For example, JSM files 24 may be executed to run tests on emulator 16. In addition, JSM files 24 may also be executed to run tests on development board 20 (of FIG. 2). In further embodiments, JSM files 24 may also be executed on other platforms. For example, in one embodiment, JSM files 24 may be executed to perform tests in a software simulation environment.

Host computer 12 may be connected to debugger 14, and host computer 12 may transfer scripts to debugger 14. In one embodiment, host computer 12 may be connected to debugger 14 via an Ethernet interface. In another embodiment, host computer 12 may be connected to debugger 14 via the Internet. In further embodiments, host computer 12 may be coupled to debugger 14 via various other types of connections and interfaces. In still further embodiments, multiple host computers 12 may connect to debugger 14 to perform tests. The multiple host computers 12 may be connected to debugger 14 via a hub, network switch, or other device.

Host computer 12 may convey JSM commands to debugger 14. In response, debugger 14 may execute commands to perform various debug operations, including reading and writing to registers and other memory values within one or more SoC models in emulator 16. Debugger 14 may also be referred to as a debug controller. In one embodiment, debugger 14 may include a translator which may convert the JSM commands into JTAG commands. Debugger 14 may then convey the JTAG commands to emulator 16. Specifically, debugger 14 may generate a bitstream that is conveyed to a test access port (TAP) of the model of the SoC in emulator 16. The bitstream may be used to setup and initialize various types of debug and test functions in the model. For example, the bitstream may be used to implement a scan dump operation, a memory dump operation, and/or other test and debug operations. In one embodiment, the bitstream may be generated to shift 32-bit values into various registers within the model of the SoC. For example, to perform a scan dump operation, a first register within the model may be set to a first value, a second register may be set to a second value, and so on.

In one embodiment, debugger 14 may have an Internet protocol (IP) address, and host computer 12 may access debugger 14 by addressing its IP address. In one embodiment, debugger 14 may provide a Tcl console including a command prompt to host computer 12 when host computer 12 connects and logs in to debugger 14. The Tcl console may have a built-in library of commands for a user to access and use for controlling emulator 16. The Tcl console may allow users to enter commands on the host computer 12 for execution on debugger 14.

Debugger 14 may be configured to source a translator software application from host computer 12. Debugger 14 may also be configured to translate a first group of commands (i.e., a script) from a first language into a second group of commands in a second language, and debugger 14 may then be configured to transmit the second group of commands as a bitstream to the model running in emulator 16. The bitstream may cause the model to run one or more tests and/or perform one or more operations. In one embodiment, the interface between debugger 14 and emulator 16 may be a JTAG interface. In other embodiments, the interface between debugger 14 and emulator 16 may be any of various other types of interfaces, such as a serial (via a UART) or a parallel interface, or the like. In one embodiment, "sourcing" the translator software application may include reading commands from the translator software application and evaluating them as if the commands had been entered manually on a command line prompt. A "source" command may take the contents of a specified file (e.g., the translator software application) and passes the contents to an interpreter as a text script. In one embodiment, the interpreter may be a TCL interpreter. Additionally, sourcing a file may mean that the sourced file, script or application is executed in the current context. In other words, a sourced script may have access to all variables existing in that context.

In one embodiment, emulator 16 may include one or more software models of SoCs and/or other hardware components. In various embodiments, the software models may be designed in a hardware description language (HDL) (e.g., Verilog, very high speed integrated circuits HDL (VHDL)). Prior to being implemented within emulator 16, the models may be simulated on an event-driven gate-level logic simulator (not shown) or an instruction set simulator (not shown).

In one embodiment, emulator 16 may include special emulation hardware. In such an embodiment, emulator 16 may map a synthesized HDL design onto the special emulation hardware. Such emulation hardware may comprise many re-programmable FPGA devices and/or special purpose processors, and the emulation hardware may execute a model of the HDL design.

In various embodiments, emulator 16 may be a verification platform for simulating a system on a chip. Emulator 16 may include a plurality of processors for executing simulation code in parallel. Emulator 16 may be used to run tests that simulate the functionality of a SoC, and emulator 16 may be utilized for running tests prior to the fabrication of a SoC. In one embodiment, emulator 16 may be a Palladium® series emulator from Cadence Design Systems®. In various embodiments, emulator 16 may simulate a synthesized netlist of the HDL design.

Emulator 16 may also be coupled to host computer 18. Host computer 18 may provide real-time access to the various values and states within models running on emulator 16. The values of various registers, gates, and flip-flops within emulator 16 may be visible at all times through host computer 18.

In one embodiment, a method for testing a model of a SoC may be implemented by design verification system 10. The method may involve running a script containing one or more executable commands, wherein the commands are in a first language. The script may be sourced from host computer 12 to debugger 14. In addition, a translation software application may be sourced from host computer 12 to debugger 14. The translation software application may be executed by debugger 14, and executing the application may cause the commands of the script to be translated from the first language to a second language. The commands in the second language may be executed by debugger 14, and this may cause a set of control signals to be conveyed to the SoC model in emulator 16.

Host computer 12, host computer 18, and debugger 14 may include various hardware and software components. The hardware components may include one or more processors, memory devices, display devices, and input/output (I/O) devices, connected together via a bus architecture. The software components may include an operating system stored in a memory device. The operating system may be any of various types of operating systems, such as Apple® Mac OS or iOS, Linux®, Unix®, Solaris®, Microsoft Windows®, or others. It is noted that test and debug environment 10 may include other components and connections/interfaces not shown in FIG. 1.

Figure 2:
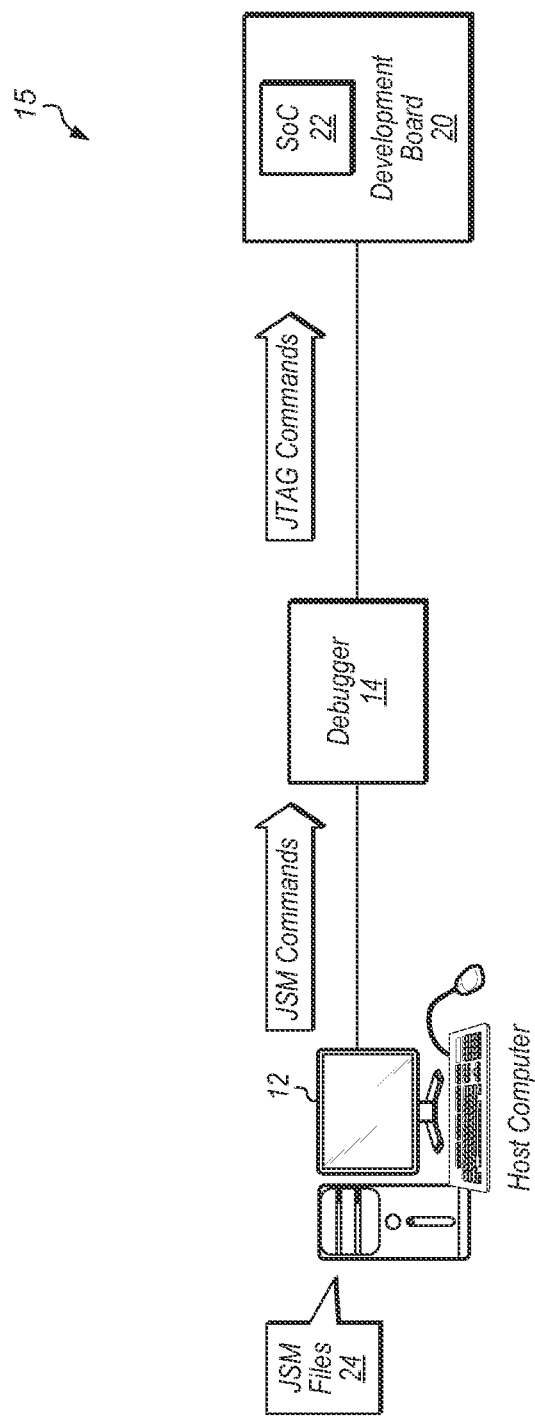
FIG. 2 is a block diagram illustrating another embodiment of a design verification system.

Turning now to FIG. 2, a block diagram of another embodiment of a design verification system 15 is shown. Design verification system 15 may include development board 20, which may be a printed circuit board in one embodiment. Development board 20 may include one or more fabricated chips, such as system on a chip (SoC) 22. In the various tests and operations executed on development board 20, SoC 22 may be configured to operate in its target environment and to run at its target speed.

It is noted that development board 20 may also include other components not shown in FIG. 2. These other components may include I/O connectors, I/O circuits, buffers, voltage regulators, power connectors, and/or various other components. In various embodiments, SoC 22 may also be referred to as an integrated circuit (IC) or as an application specific integrated circuit (ASIC). SoC 22 may be utilized in a variety of end products, such as cell phones, smartphones, tablets, electronic reading devices, computers, servers, televisions, video game consoles, and various other products.

In various embodiments, design verification system 15 may facilitate the development and testing of SoC modules that reside on development board 20. The same scripts and JSM files that were used during development of the models of the SoC in emulator 16 (of FIG. 1) may be reused after SoC 22 has been fabricated and assembled onto development board 20. In this manner the system may provide greater flexibility and reuse capability than other systems. Although not shown in FIG. 2, in various embodiments, development board 20 may also be connected to various pieces of test equipment (e.g., logic analyzer, spectrum analyzer, power meter) to monitor the operation of board 20.

The description of techniques disclosed in regard to design verification system 10 (of FIG. 1) may also apply to design verification system 15, with development board 20 filling the role of emulator 16. For example, in one embodiment, host computer 12 may transmit JSM commands to debugger 14, and debugger 14 may translate the JSM commands into JTAG commands, and then debugger 14 may convey the JTAG commands to SoC 22. The JTAG commands may control the execution of tests and various functions of SoC 22 on development board 20.

SoC 22 may receive the JTAG commands transmitted by debugger 14, and in response, SoC 22 may perform one or more operations. While performing the one or more operations, SoC 22 may generate responses and transmit data back over the JTAG interface to debugger 14. In one embodiment, SoC 22 may include an on-chip test access port (TAP) controller that changes states in response to received JTAG commands.

In one embodiment, debugger 14 may include a software debugger tool. The software debugger tool may allow a software developer to control the execution of a software program executing on SoC 22 by setting break-points, sequentially single-stepping through the execution of the program, and looking at the program's state by examining and displaying variables and expressions. Debugger 14 may include a communication interface for transmitting debugging commands to SoC 22 on development board 20.

Figure 3:
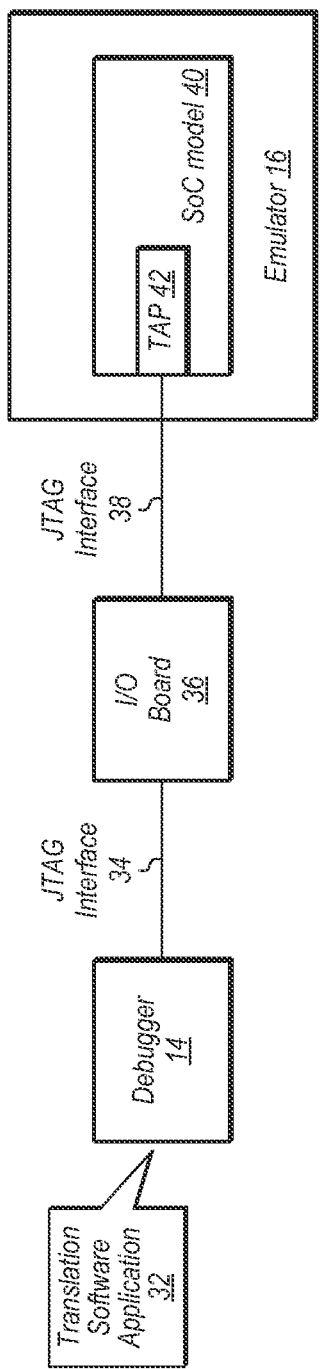
FIG. 3 is a block diagram that illustrates one embodiment of an interface between a debugger and emulator.

Referring now to FIG. 3, a block diagram of one embodiment of an interface between a debugger and emulator is shown. Debugger 14 may include translation software application 32 for translating JSM commands into JTAG commands. Translation software application 32 may also be referred to as a "translator", as a "translator application", or as a "JTAG engine byte command protocol (JEB) application". Emulator may include SoC model 40, and SoC model 40 may include a TAP 42 for transmitting and receiving data over JTAG interface 38. TAP 42 may also be referred to as a TAP controller.

In one embodiment, translation software application 32 may be sourced from host computer 12 (of FIG. 1), and once the application 32 is sourced, debugger 14 may be enabled for any JSM command. Application 32 may translate JSM commands into JTAG commands compliant with the JTAG protocol, and then the JTAG commands may be transmitted via JTAG interface 34 to the input/output (I/O) board 36. I/O board 36 may be configured to allow debugger 14 access to the JTAG interface of emulator 16. The JTAG commands received by I/O board 36 may be transmitted via JTAG interface 38 to emulator 16.

In some embodiments, debugger 14 may not have direct I/O access to the JTAG interface of SoC model 40 within emulator 16. In these embodiments, I/O board 36 may be configured to couple signals from debugger 14 to emulator 16 via JTAG interfaces 34 and 38. I/O board 36 may serve as a bus connection from emulator 16 to debugger 14. In other embodiments, there may be additional connections between I/O board 36 and emulator 16.

In one embodiment, a user on host computer 12 may connect to debugger 14. Debugger 14 may provide a Tcl console with a command line interface for the user. A command may be entered on the command line to source the application 32. In one embodiment, the command may be "source jeb.ax", wherein "jeb.ax" is the name of application 32. After application "jeb.ax" has been sourced, the Tcl console of debugger 14 will have a new command enabled called "jeb". A command such as "jeb file1.jsm" may then be entered on the command line, wherein "file1.jsm" is representative of any JSM file. The command "jeb file1.jsm" may translate the JSM commands in "file1.jsm" into JTAG commands and then convey the JTAG commands to SoC model 40 (via I/O board 36).

Figure 4:
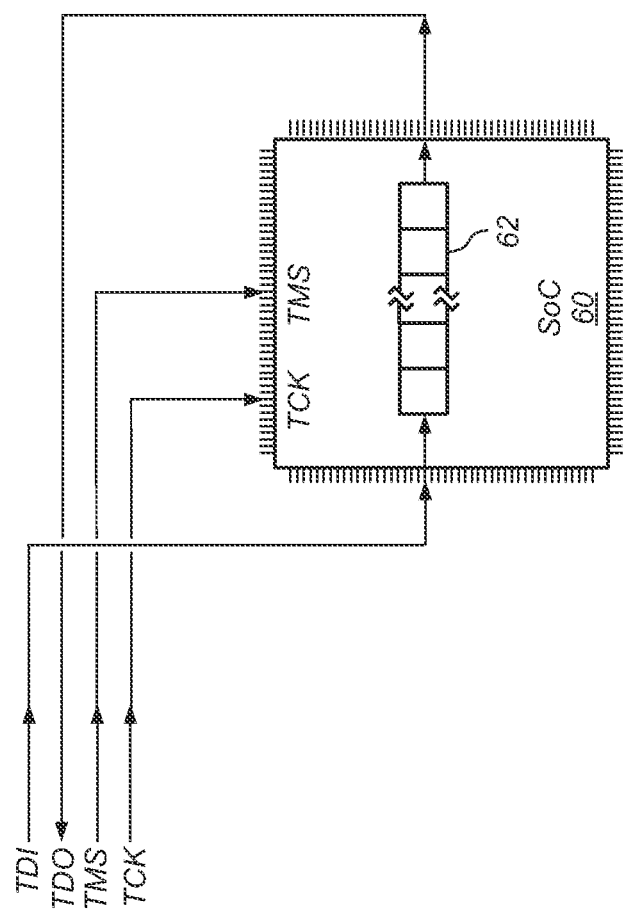
FIG. 4 is a block diagram of a JTAG interface in a SoC in accordance with one or more embodiments.

Turning now to FIG. 4, a block diagram of a JTAG interface in a SoC in accordance with one or more embodiments is shown. SoC 60 is shown in FIG. 4, and SoC 60 is coupled to a JTAG interface. In other embodiments, more than one SoC may be coupled to the JTAG interface. The JTAG interface may include the following signals: test data input (TDI), test data output (TDO), test-mode select (TMS), and test clock (TCK). In other embodiments, the JTAG interface may include other signals (e.g., test-reset pin (TRST)). The signal TDI may be coupled to register 62 of SoC 60. The output of register 62 may be connected to the signal TDO. Register 62 may be of any length. For example, in one embodiment, register 62 may be 32 bits long. In other embodiments, register 62 may be any of various other bit-lengths.

In one embodiment, SoC 60 may enter shift-IR state, and then register 62 may be placed in the scan path between TDI and TDO. Instruction data may be shifted serially through register 62 on each TCK cycle. In response to one or more values being written to register 62, SoC 60 may execute one or more instructions and/or generate corresponding internal control signals.

Figure 5:
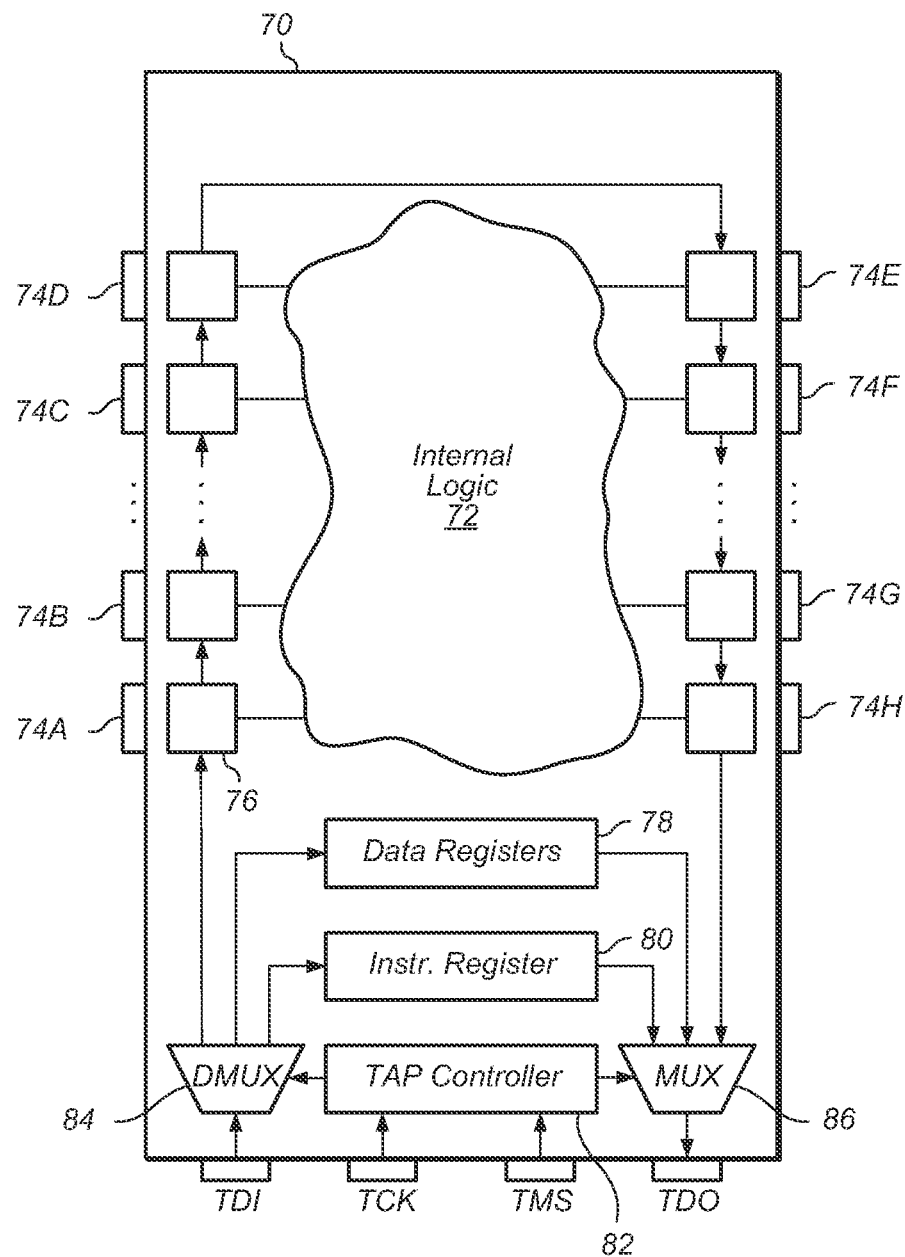
FIG. 5 is a block diagram of one embodiment of a SoC with a JTAG interface.

Turning now to FIG. 5, a block diagram of one embodiment of a SoC with a JTAG interface is shown. SoC 70 may be coupled to the JTAG signals TDI, TCK, TMS, and TDO. TCK and TMS may be connected to test access port (TAP) controller 82. SoC 70 may include any number of physical pins 74A-H. TAP controller 82 may also be coupled to multiplexer 86 and demultiplexer 84. TDI may be coupled to demultiplexer 84 and TDO may be coupled to multiplexer 86. The output of demultiplexer 84 may be coupled to scan chain 76, data registers 78, and instruction register 80.

The output of demultiplexer 84 may be coupled to the first boundary scan cell in the chain of boundary scan cells 76. As shown in FIG. 5, the scan chain 76 includes the pads connected to the physical pins 74A-H. Scan chain 76 may also include connections to flip-flops within internal logic 72. In other embodiments, SoC 70 may include other components not shown in FIG. 5, some components shown in FIG. 5 may be omitted, and/or the overall structure of SoC 70 may be organized in a variety of other ways.

In one embodiment, instruction register 80 may be a 32-bit register. In other embodiments, instruction register 80 may be any of various other bit-lengths. Instruction register 80 may be loaded through the TDI and TDO pins. Values corresponding to various instructions may be written into instruction register 80. To load values into instruction register 80, a debugger (not shown) may first put TAP controller 82 into the Shift-IR state, and then the debugger may send a bitstream through TDI. Various values may also be loaded into data registers 78 in a similar manner.

Referring now to FIG. 6, a table of example JSM commands in accordance with one or more embodiments is shown. Table 90 includes a list of sample JSM commands that may be used in a design verification environment. Additional JSM commands may also be defined and used, and the example commands in table 90 are illustrative examples of a portion of JSM commands which may be utilized to test simulated models, models in emulators, and actual physical SoCs. The model or SoC may include a TAP controller, instruction register, data registers, and various other registers and control logic.

The JSM command "INIT" may be used to initialize a design under test (DUT). In various embodiments, the DUT may be a simulation model, emulation model, and/or a SoC. The "INIT" command may also enable a debugger, such as debugger 14 (of FIG. 1), to establish communication with a TAP controller of a SoC or model of a SoC. The JSM command "SHIR" may enable the TAP controller to enter a specific operating mode. For example, "SHIR" may be used to put the TAP controller into the Shift-IR "state" or "mode". When the TAP controller is in the Shift-IR mode, the instruction register may be connected between the JTAG TDI and TDO pins. The instruction argument included with the "SHIR" command may be loaded into the instruction register. In another example, the JSM command "SHIR STOP CLK" may cause the TAP controller to enter an idle mode or to run a test.

The JSM command "SHDR" may be utilized to put the TAP controller into Shift-DR mode, wherein the data registers are connected between the TDI and TDO pins. The length argument may be an integer representation of the bit length of the data argument. In one example, "SHDR" may be utilized to put the TAP controller into a run test mode. The JSM command "SHDM" may include length and pattern arguments. The length argument may be an integer representation of the bit length of the total amount of data to be written, and the pattern argument may be the input bit pattern that will be driven on the TDI signal.

The JSM command "MSIR" may be used as part of a memory dump operation. The first instruction may be loaded to the TAP instruction register, and the second instruction may be loaded into a built-in self test (BIST) register. For example, the command "MSIR MEM_DUMP SET_BISTON" may set the TAP controller to initiate a memory dump operation and to activate the BIST.

The JSM command "MMPR" may utilize an advanced peripheral bus (APB) interface to send a read transaction of the address specified to the DUT. The JSM command "MMPW" may utilize an APB interface to send a write transaction to the DUT location specified by the address argument with the data argument. The JSM command "MMHR" may utilize an advanced high-performance bus (AHB) interface to perform a read of the DUT at the address specified in the address argument. The JSM command "MMHW" may utilize an AHB interface to send a write transaction to the DUT location specified by the address argument with the data argument.

Figure 7:
FIG. 7 is a JSM file in accordance with one or more embodiments.

Turning now to FIG. 7, a JSM file in accordance with one or more embodiments is shown. JSM file 100 includes a plurality of JSM commands. In the example shown in FIG. 7, JSM file 100 may be utilized to run a scan dump operation for at least one partition of a DUT. The JSM commands in JSM file 100 may be translated to JTAG commands by a translator application. The JTAG commands may be sent to a TAP controller of the DUT. JSM file 100 is an illustrative example of one JSM file, and in other embodiments, other JSM files may include any number and type of JSM commands.

Figure 8:
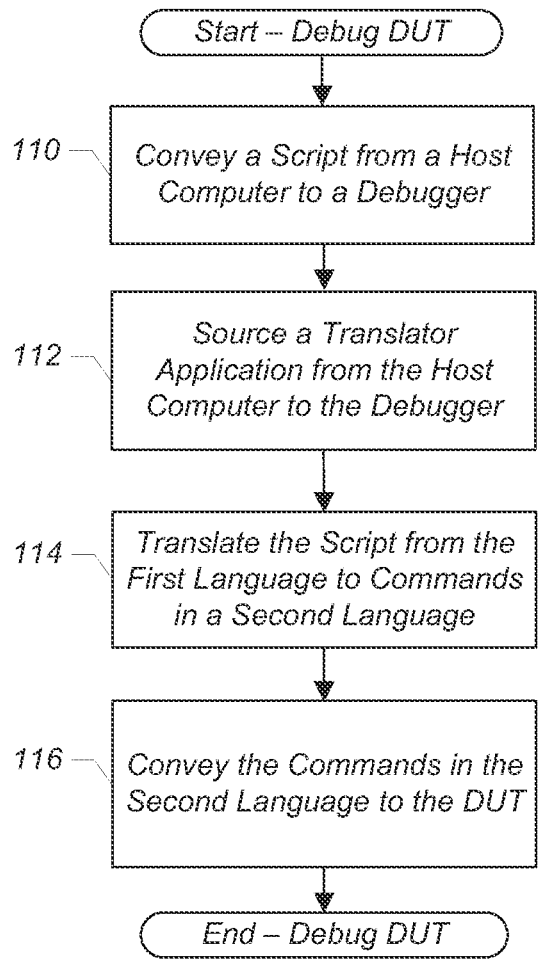
FIG. 8 is a generalized flow diagram illustrating one embodiment of a method for debugging a design under test (DUT).

Referring now to FIG. 8, one embodiment of a method for debugging a design under test (DUT) is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

A script may be conveyed from a host computer to a debugger (block 110). The script may comprise a command which may invoke one or more files, and the one or more files may include a plurality of commands written in a first language. In one embodiment, the first language may be JSM. The script may be invoked on a command line on the host computer. The debugger may provide a Tcl console to the host computer, and the Tcl console may include the command line interface used to invoke the script.

A translator application may be sourced from the host computer to the debugger (block 112). The translator application may be configured to translate the script from a first language into one or more commands of a second language (block 114). After the script has been translated, the one or more commands in the second language may be conveyed to the DUT (block 116). In one embodiment, the DUT may be a model of a SoC in an emulator. In another embodiment, the DUT may be an actual fabricated SoC on a development board. In other embodiments, the DUT may be any of various other types of software models within different testing and simulation platforms, or the DUT may be any of various other types of physical devices.

Figure 9:
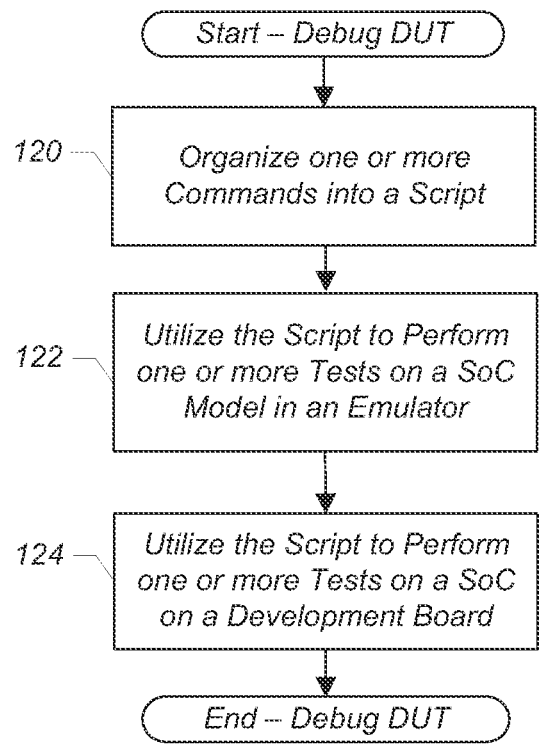
FIG. 9 is a generalized flow diagram illustrating one embodiment of a method for verifying both a SoC model and a physical SoC.

Referring now to FIG. 9, one embodiment of a method for verifying both a SoC model and a physical SoC is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

One or more commands may be organized into a script (block 120). The one or more commands may be in a first language. In one embodiment, the first language may be JSM. The script may be utilized to perform one or more tests on a SoC model in an emulator (block 122). Then, the script may be utilized to perform one or more tests on a SoC on a development board (block 124). In one embodiment, the one or more tests performed on the SoC on the development board may not occur immediately after the one or more tests are performed on the SoC model in the emulator. Regardless of the period of time between the tests, the same script may be used for testing both the SoC model in the emulator and the SoC on the development board. In another embodiment, a plurality of scripts may be reused for testing both the SoC model in the emulator and the actual SoC on the development board.

Utilizing the script may begin by invoking the script on a host computer. The script may be invoked on a command line of a console on the host computer. In one embodiment, the console may be a Tcl console, and the Tcl console may be provided to the host computer by a debugger. Next, the script may be translated into one or more commands in a second language. Then, the one or more command in the second language may be conveyed by the debugger to either the SoC model in the emulator (for block 122) or to the SoC on the development board (for block 124).

Figure 10:
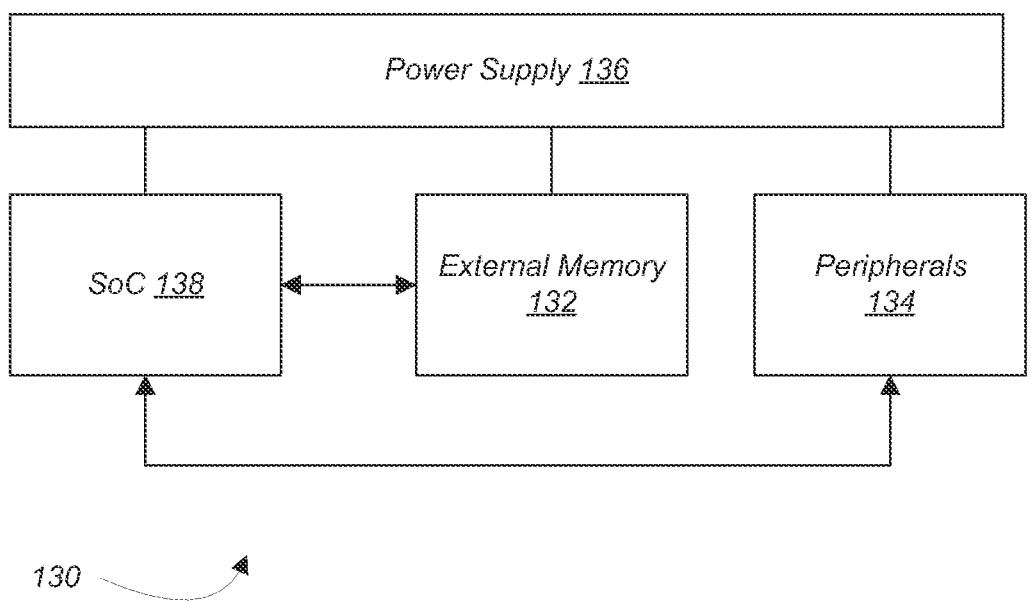
FIG. 10 is a block diagram illustrating one embodiment of a system including a SoC.

Turning now to FIG. 10, a block diagram of one embodiment of a system 130 is shown. In the illustrated embodiment, the system 130 includes at least one instance of a SoC 138 coupled to external memory 132. SoC 138 may be any of the previously described SoCs, such as SoC 22, 60, or 70. SoC 138 is coupled to one or more peripherals 134 and the external memory 132. A power supply 136 is also provided which supplies the supply voltages as well as one or more supply voltages to the integrated circuit 10, memory 132, and/or the peripherals 134. In other embodiments, more than one power supply 136 may be provided. In some embodiments, more than one instance of SoC 138 may be included (and more than one external memory 132 may be included as well).

The peripherals 134 may include any desired circuitry, depending on the type of system 130. For example, in one embodiment, the system 130 may be a mobile device (e.g., personal digital assistant (PDA), smart phone, electronic reading device) and the peripherals 134 may include devices for various types of wireless communication, such as Wi-Fi, Bluetooth, cellular, global positioning system, etc. The peripherals 134 may also include additional storage, including RAM storage, solid state storage, or disk storage. The peripherals 134 may include user interface devices such as a display screen, including touch display screens or multitouch display screens, keyboard or other input devices, microphones, speakers, etc. In other embodiments, the system 130 may be any type of computing system (e.g., desktop personal computer, laptop, workstation, video game console, nettop).

The design verification techniques disclosed herein can be implemented in a variety of ways including, as a system, device, method, and a computer readable medium. It is noted that the illustrated systems may comprise various forms and types of software. In one embodiment, program instructions and/or a database that represent the described systems, components, and/or methods may be stored on a computer readable storage medium. Generally speaking, a computer readable storage medium may include any non-transitory storage media accessible by a computer during use to provide instructions and/or data to the computer. For example, a computer readable storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM)), ROM, non-volatile memory (e.g. Flash memory) accessible via a peripheral interface such as the USB interface, etc. Storage media may include micro-electro-mechanical systems (MEMS), as well as storage media accessible via a communication medium such as a network and/or a wireless link.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
    a host computer;
    a debugger coupled to the host computer;
    an emulator, wherein the emulator comprises a software model of a system on chip (SoC); and
    the SoC;
    wherein the debugger is configured to:
        interface to the emulator and the SoC;
        invoke a first script to perform a first operation on the software model of the SoC;
        invoke the first script to perform the first operation on the SoC; and
        utilize a translator software application to convert the first script from a first language to a second language, wherein the first language includes a layer of abstraction on top of the second language, and wherein the second language is a joint test action group (JTAG) protocol compliant language.

2. The system as recited in claim 1, wherein the debugger is further configured to:
    source the translator software application from the host computer.

3. The system as recited in claim 1, wherein the debugger is configured to generate a command language console, and wherein the console is accessible on the host computer.

4. The system as recited in claim 3, wherein the command language console is configured to accept commands in the first language.

5. The system as recited in claim 1, wherein the first operation is a memory dump operation.

6. The system as recited in claim 1, wherein the host computer is coupled to the debugger via an Ethernet interface.

7. The system as recited in claim 1, wherein the host computer is coupled to the debugger via an Internet remote connection.

8. A system comprising:
    a development board, wherein the development board comprises a system on a chip (SoC);
    an emulator, wherein the emulator comprises a software model of the SoC;
    a debugger coupled to the development board; and
    a host computer coupled to the debugger;
    wherein the debugger is configured to:
        receive a first group of commands from the host computer, wherein the first group of commands are in a first language;
        utilize a translator application to translate the first group of commands into a second group of commands in a second language;
        convey the second group of commands in the second language to perform a first operation on the software model of the SoC; and
        convey the second group of commands in the second language to perform the first operation on the SoC on the development board.

9. The system as recited in claim 8, wherein the first language includes a layer of abstraction on top of the second language, and wherein the second language is a joint test action group (JTAG) protocol compliant language.

10. The system as recited in claim 8, wherein the first operation is a memory dump operation.

11. The system as recited in claim 8, wherein the translator application is invoked on a console on the host computer.

12. The system as recited in claim 9, wherein the SoC comprises a test access port (TAP) controller and an instruction register, and wherein at least one of the second group of commands is configured to store a value in the instruction register.

13. The system as recited in claim 12, wherein at least one of the second group of commands is configured to put the TAP controller in a Shift-IR state.

14. A method comprising:
    conveying a script from a host computer to a debugger, wherein the script comprises one or more commands in a first language;
    utilizing a translator application to translate the one or more commands from the first language to a second language; and conveying the one or more commands in the second language to an emulator comprising a software model of a system on chip (SoC) to perform a first operation;

wherein said one or more commands in the second language are utilizable by the SoC to perform said first operation on the SoC.

15. The method as recited in claim 14, wherein prior to conveying the script from the host computer to the debugger, the method comprising invoking the script on a command line on the host computer.

16. The method as recited in claim 14, further comprising the debugger providing a console to the host computer, and wherein the console comprises a command line interface.

17. The method as recited in claim 14, wherein the first language includes a layer of abstraction on top of the second language, and wherein the second language is a joint test action group (JTAG) protocol compliant language DUT is a software model in an emulator.

18. The method as recited in claim 14, wherein the first operation is a memory dump operation.

19. A method comprising:
organizing one or more commands into a script, wherein the one or more commands are in a first language;
utilizing the script to perform one or more tests on a model of a system on chip (SoC) in an emulator; and
utilizing the script to perform the one or more tests on the SoC on a development board;
wherein the first language includes a layer of abstraction on top of a second language, and wherein the second language is a joint test action group (JTAG) protocol compliant language.

20. The method as recited in claim 19, wherein utilizing the script to perform one or more tests on the model of the SoC in the emulator comprises:
invoking the script;
translating the script into one or more commands in a second language; and
executing the one or more commands in the second language to send one or more control signals to the model of the SoC in the emulator.

21. The method as recited in claim 19, wherein utilizing the script to perform one or more tests on the SoC on the development board comprises:
invoking the script;
translating the script into one or more commands in a second language; and
executing the one or more commands in the second language to send one or more control signals to the SoC on the development board.

22. The method as recited in claim 20, wherein the one or more tests include a memory dump operation.

* * * * *

UNITED STATES PATENT AND TRADEMARK OFFICE
CERTIFICATE OF CORRECTION

PATENT NO. : 8,639,981 B2  
APPLICATION NO. : 13/220139  
DATED : January 28, 2014  
INVENTOR(S) : Andrew K. Chong It is certified that error appears in the above-identified patent and that said Letters Patent is hereby corrected as shown below:

In the Claims:

Claim 17, Column 13, Lines 17-18, please delete "DUT is a software model in an emulator"

Signed and Sealed this  
First Day of April, 2014

Michelle K. Lee  
*Deputy Director of the United States Patent and Trademark Office*